(12) United States Patent
Kim

(10) Patent No.: US 8,885,427 B2
(45) Date of Patent: Nov. 11, 2014

(54) PRECHARGE CIRCUIT AND NON-VOLATILE MEMORY DEVICE

(71) Applicant: SK Hynix Inc., Gyeonggi-do (KR)

(72) Inventor: Sang-Hwan Kim, Gyeonggi-do (KP)

(73) Assignee: SK Hynix Inc., Gyeonggi-do (KR)

( * ) Notice: Subject to any disclaimer, the term of this patent is extended or adjusted under 35 U.S.C. 154(b) by 29 days.

(21) Appl. No.: 13/718,182

(22) Filed: Dec. 18, 2012

(65) Prior Publication Data

US 2013/0163362 A1 Jun. 27, 2013

(30) Foreign Application Priority Data

Dec. 22, 2011 (KR) .................. 10-2011-0140480

(51) Int. Cl.
*G11C 7/00* (2006.01)
*G11C 7/08* (2006.01)
*G11C 7/12* (2006.01)

(52) U.S. Cl.
CPC .. *G11C 7/00* (2013.01); *G11C 7/08* (2013.01); *G11C 7/12* (2013.01)
USPC .............. 365/203; 365/185.07; 365/185.18; 365/185.2; 365/185.21; 365/185.25; 365/154; 365/189.05; 365/189.09; 365/202; 365/205; 365/207

(58) Field of Classification Search
CPC ........ G11C 7/12; G11C 16/26; G11C 7/1048; G11C 11/4091
USPC .............. 365/185.07, 185.18, 185.2, 185.21, 365/185.25, 154, 156, 189.05, 189.09, 202, 365/203, 205, 207
See application file for complete search history.

(56) References Cited

U.S. PATENT DOCUMENTS

| 5,909,394 | A * | 6/1999 | Chou .................. 365/185.21 |
| 6,219,290 | B1 * | 4/2001 | Chang et al. .................. 365/207 |
| 6,519,191 | B1 * | 2/2003 | Morishita ................ 365/189.09 |
| 8,218,390 | B2 * | 7/2012 | Nii et al. ........................ 365/226 |
| 2010/0226192 | A1 | 9/2010 | Moon et al. |

FOREIGN PATENT DOCUMENTS

KR    1020100068658    6/2010

* cited by examiner

*Primary Examiner* — Fernando Hidalgo
(74) *Attorney, Agent, or Firm* — IP & T Group LLP

(57) ABSTRACT

A precharge circuit includes a precharge unit configured to apply a voltage of a precharge voltage terminal to a data line during a precharge operation, and a sensing unit configured to disable the precharge unit by sensing the voltage of the precharge voltage terminal. The precharge circuit may control a precharge operation by sensing a change in the voltage level of the precharge voltage terminal.

13 Claims, 6 Drawing Sheets

PRECHARGE CIRCUIT AND NON-VOLATILE MEMORY DEVICE

CROSS-REFERENCE TO RELATED APPLICATIONS

The present application claims priority of Korean Patent Application No. 10-2011-0140480 filed on Dec. 22, 2011, which is incorporated herein by reference in its entirety.

BACKGROUND

1. Field

Exemplary embodiments of the present invention relate to a precharge circuit for supplying a precharge voltage to a data line.

2. Description of the Related Art

An integrated circuit chip that inputs/outputs data through a data line uses a precharge circuit in order to precharge the data line for the next operation after completing a data input operation or a data output operation.

FIG. 1 is a schematic diagram illustrating a conventional non-volatile memory device including a precharge circuit. The conventional non-volatile memory device shown in FIG. 1 includes a plurality of page buffers 10_0 to 10_N, a precharger 20, and a sense amplifier 30.

The precharger 20 applies the voltage of a precharge voltage terminal PVND to a positive local input/output line LIO and a negative local input/output line LIOB during a precharge operation. FIG. 1 illustrates a case that a core voltage VCC is supplied as the voltage of the precharge voltage terminal PVND. To be specific, in a duration when a precharge signal is in a logic high level (which is a duration when an second inverted precharge signal PCGB is in a logic low level), the voltage VCC of the precharge voltage terminal PVND is applied to the positive local input/output line LIO and the negative local input/output line LIOB. The second inverted precharge signal PCGB is a signal whose phase is in opposite to the precharge signal. Therefore, the voltage levels of the positive local input/output line LIO and the negative local input/output line LIOB become the same as the voltage level of the core voltage VCC during a precharge operation.

The page buffers 10_0 to 10_N perform a program operation for storing data D0 to DN in a memory cell array (not shown) and a read operation for reading the data D0 to DN out of the memory cell array (not shown). Each of the page buffers 10_0 to 10_N illustrated in FIG. 1 includes a latch which is formed of two inverters I1 and I2. The page buffers 10_0 to 10_N latch the data D0 to DN that are read out of the memory cell array (not shown), and when a column selection signal CS<0:N> is enabled, the page buffers 10_0 to 10_N transfer the latched data D0 to DN to the positive local input/output line LIO and the negative local input/output line LIOB. The column selection signal CS<0:N> is generated by a column decoder 15 illustrated in FIG. 2. In other words, the column decoder 15 generates the column selection signal CS<0:N> by decoding an inputted column address CA<0:M> and the column selection signal CS<0:N> is enabled to a logic high level, which is the voltage level of the core voltage VCC, based on the column address CA<0:M>.

The sense amplifier 30 senses the voltage level difference between the positive local input/output line LIO and the negative local input/output line LIOB, amplifies the data, and transfers the amplified data to a global data input/output line GIO.

FIG. 3A is a timing diagram illustrating a read operation of the non-volatile memory device shown in FIG. 1 when no power drop occurs in the voltage level of a precharge voltage terminal PVND.

The second inverted precharge signal PCGB is in a logic low level in a precharge duration $T_{PCG}$. PMOS transistors P1 and P2 of the precharger 20 are turned on in response to the second inverted precharge signal PCGB of the a logic low level, and the voltage VCC of the precharge voltage terminal PVND is applied to the positive local input/output line LIO and the negative local input/output line LIOB. Therefore, the voltage levels of the positive local input/output line LIO and the negative local input/output line LIOB become the core voltage VCC in the precharge duration $T_{PCG}$.

The second inverted precharge signal PCGB transitions to a logic high level in a sensing duration $T_{SEN}$. The PMOS transistors P1 and P2 of the precharger 20 are turned off in response to the second inverted precharge signal PCGB of a logic high level. Therefore, the voltage VCC of the precharge voltage terminal PVND is not applied to the pair of the positive local input/output line LIO and the negative local input/output line LIOB anymore.

Meanwhile, column selection signals CS<0:N> are generated as an inputted column address CA<0:M> is decoded, and among the generated column selection signals CS<0:N>, a column selection signal corresponding to a page buffer designated by the column address CA<0:M> is enabled to a logic high level in the sensing duration $T_{SEN}$. FIG. 3A shows a case that the $0^{th}$ column selection signal CS<0> is enabled to a logic high level in the sensing duration $T_{SEN}$. When the $0^{th}$ column selection signal CS<0> is enabled to a logic high level, NMOS transistors N1 and N2 of the $0^{th}$ page buffer 10_0 that corresponds to the $0^{th}$ column selection signal CS<0> are turned on to transfer data D0 and /D0 that are latched in the $0^{th}$ page buffer 10_0 to the positive local input/output line LIO and the negative local input/output line LIOB. Hereinafter, for the description purposes, a case that the data D0 latched in the $0^{th}$ page buffer 10_0 is in a logic high level (which is a case that the inverted data /D0 is in a logic low level) is described as a example. The NMOS transistor N1 is turned on in response to the $0^{th}$ column selection signal CS 0> of a logic high level, and the inverted data /D0 is transferred to the negative local input/output line LIOB. Since the inverted data /D0 of a logic low level, which is a ground voltage VSS, is transferred to the negative local input/output line LIOB, the voltage level of the negative local input/output line LIOB drops.

On the contrary, the voltage level of the positive local input/output line LIO to which the data D0 of the same logic high level as the core voltage VCC is transferred through the NMOS transistor N2 of the $0^{th}$ page buffer 10_0 maintains the voltage level of the core voltage VCC.

For this reason, voltage level difference dV is caused between the positive local input/output line LIO and the negative local input/output line LIOB, and the sense amplifier 30 amplifies the data by sensing the voltage level difference dV between the positive local input/output line LIO and the negative local input/output line LIOB in response to an amplification enabling signal SA_EN, that is enabled to a logic high level, and transfers the amplified data to a global data input/output line GIO.

Meanwhile, if the voltage level VCC of the precharge voltage terminal PVND is not maintained at a constant level, it is not sure whether the sensing operation is performed accurately. In particular, since the non-volatile memory device simultaneously accesses the data of the memory cell array (not shown) on the basis of a page by using the multiple page buffers 10_0 to 10_N, it consumes much current and this leads to a power drop. If the voltage level of the precharge voltage terminal PVND of the precharger 20 drops due to the simultaneous access of the page buffers 10_0 to 10_N to the data of the memory cell array (not shown), the voltage level difference dV between the positive local input/output line LIO and the negative local input/output line LIOB may not be adequate for making sure a stable sensing operation. This is described in detail with reference to FIG. 3B.

FIG. 3B is a timing diagram illustrating a read operation of the non-volatile memory device shown in FIG. 1 when a power drop occurs in the voltage level of the precharge voltage terminal PVND in the precharge duration $T_{PCG}$. For the description purposes, FIG. 33 shows a case that the core voltage VCC is supplied as the voltage of the precharge voltage terminal PVND.

When a power drop occurs in the core voltage VCC in the precharge duration $T_{PCG}$, the precharger 20 applies the decreased core voltage VCC to the positive local input/output line LIO and the negative local input/output line LIOB. As a result, the voltage levels of the positive local input/output line LIO and the negative local input/output line LIOB drop as the core voltage VCC has dropped.

When the $0^{th}$ column selection signal CS<0> is enabled to a logic high level and the inverted data /D0 of a logic low level is transferred to the negative local input/output line LIOB in the sensing duration $T_{SEN}$, the voltage level of the negative local input/output line LIOB is decreased even lower. Since the voltage level of the positive local input/output line LIO has been also lowered due to the power drop occurring in the core voltage VCC, which is the precharge voltage, the voltage level difference dV between the positive local input/output line LIO and the negative local input/output line LIOB is too small to perform a sensing operation as illustrated in FIG. 3B. Here, the minimum voltage level difference dV between the ends of the positive local input/output line LIO and the negative local input/output line LIOB at which the sense amplifier 30 may perform a sensing operation is referred to as an offset. The offset of the sense amplifier 30 may be generated by mismatch of the sense amplifier 30. As illustrated in FIG. 3B, if the voltage level difference dV between the ends of the positive local input/output line LIO and the negative local input/output line LIOB of a pair may not be secured more than the offset, the sense amplifier 30 may not perform a sensing operation accurately.

SUMMARY

Exemplary embodiments of the present invention are directed to a precharge circuit that may control a precharge operation by sensing a change in the voltage level of a precharge voltage terminal.

In accordance with an exemplary embodiment of the present invention, a precharge circuit includes a precharge unit configured to apply a voltage of a precharge voltage terminal to a data line during a precharge operation and a sensing unit configured to disable the precharge unit by sensing the voltage of the precharge voltage terminal.

In accordance with another exemplary embodiment of the present invention, a non-volatile memory device includes an access unit configured to access a data of a memory cell; a data line configured to receive the data of the memory cell through the access unit, a precharge unit configured to apply a voltage of a precharge voltage terminal to the data line during a precharge operation, and a sensing unit configured to disable the precharge unit when the voltage of the precharge voltage terminal goes out of a threshold range.

DETAILED DESCRIPTION

Figure 1:
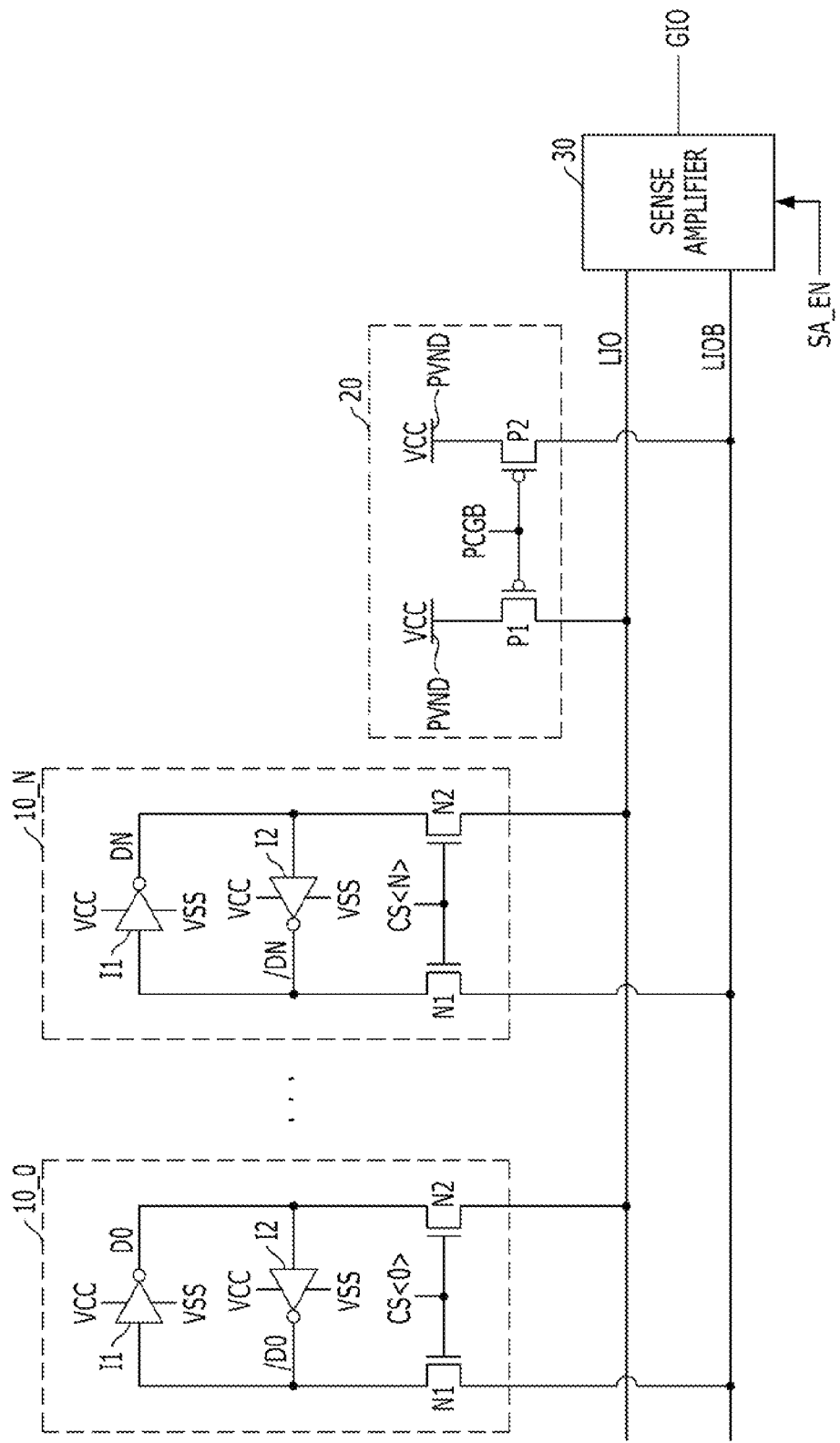
FIG. 1 is a schematic diagram illustrating a conventional non-volatile memory device including a precharge circuit.
Figure 2:
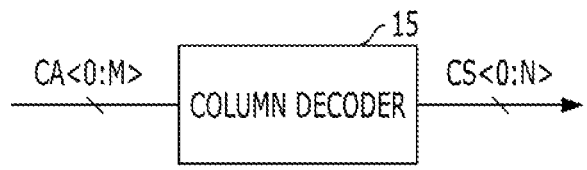
FIG. 2 illustrates a column decoder 15 for generating a column selection signal CS<0:N> shown in FIG. 1.
Figure 3A:
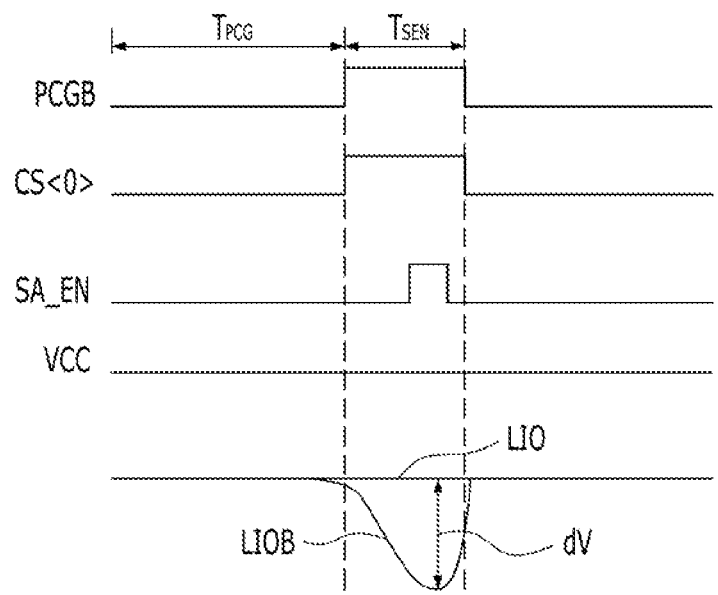
FIG. 3A is a timing diagram illustrating a read operation of the non-volatile memory device shown in FIG. 1 when no power drop occurs in the voltage level of a precharge voltage terminal.
Figure 3B:
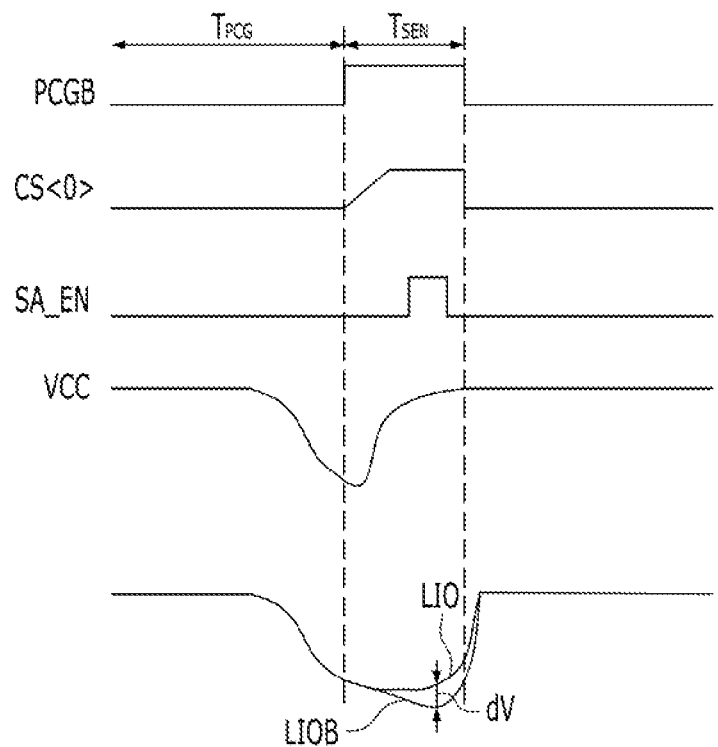
FIG. 3B is a timing diagram illustrating a read operation of the non-volatile memory device shown in FIG. 1 when a power drop occurs in the voltage level of the precharge voltage terminal.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
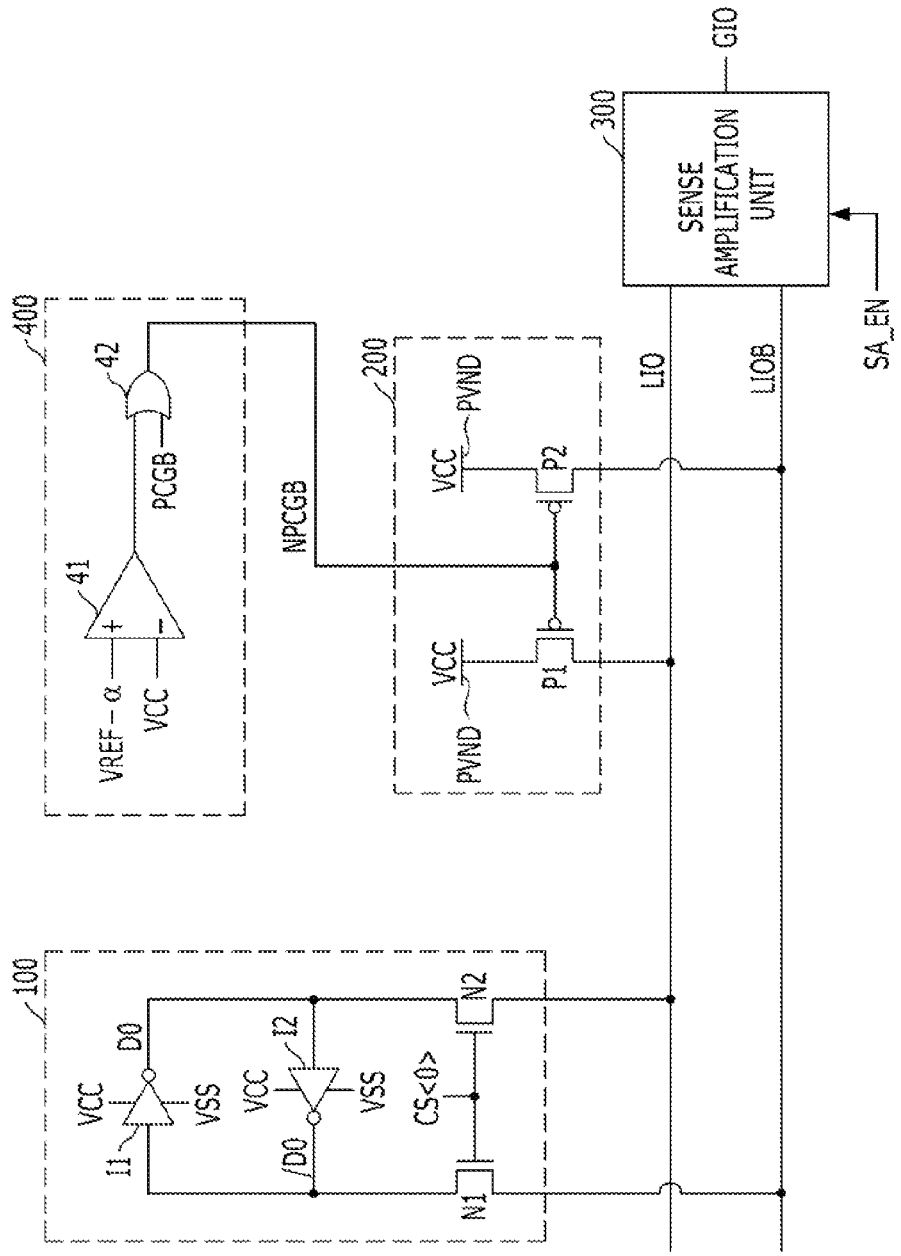
FIG. 4 is a schematic diagram illustrating a non-volatile memory device in accordance with an exemplary embodiment of the present invention.

FIG. 4 is a schematic diagram illustrating a non-volatile memory device in accordance with an exemplary embodiment of the present invention.

The non-volatile memory device may include an access unit 100, data lines LIO and LIOB, a precharge unit 200, a sensing unit 400, and a sense amplification unit 300.

The access unit 100 accesses a data D0 stored in a memory cell (not shown). The access unit 100 is known as a page buffer in a non-volatile memory device. The page buffer 100 performs a program operation for storing a data D0 in a memory cell (not shown) and performs a read operation for reading the data D0 out of the memory cell (not shown). The page buffer 100 transfers latched data D0 and /D0 to the data lines LIO and LIOB in response to a selection signal CS<0>, which corresponds to the page buffer 100. The inverted data /D0 is a signal obtained by inverting the data D0. To be specific, the page buffer 100 is designed to include a plurality of inverters I1 and I2 and a plurality of transistors N1 and N2.

FIG. 4 illustrates a case that the page buffer 100 includes two inverters I1 and I2 and two NMOS transistors N1 and N2. The two inverters I1 and I2 latch the data D0 and /D0 that are read out of the memory cell (not shown). The two NMOS transistors N1 and N2 are turned on/off in response to the column selection signal CS<0> corresponding to the page buffer 100. When the column selection signal CS<0> is in a logic high level, the NMOS transistors N1 and N2 are turned on to transfer the latched data D0 and /D0 to the data lines LIO and LIOB. When the column selection signal CS<0> is in a logic low level, the NMOS transistors N1 and N2 are turned off so that the latched data D0 and /D0 are not transferred to the data lines LIO and LIOB.

The data lines LIO and LIOB receive the data D0 and /D0 that are read by the page buffer 100 when the page buffer 100 is selected in response to the column selection signal CS<0>. FIG. 4 illustrates a case that the data lines LIO and LIOB are a positive local input/output line LIO and a negative local input/output line LIOB. To be specific, when the NMOS transistor N2 of the page buffer 100 is turned on in response to the column selection signal CS<0>, the non-volatile memory device may be designed to transfer the latched data D0 to the positive local input/output line LIO. When the NMOS transistor N1 of the page buffer 100 is turned on in response to the column selection signal CS<0>, the non-volatile memory device may be designed to transfer the latched inverted data /D0 to the negative local input/output line LIOB.

The precharge unit 200 applies the voltage of a precharge voltage terminal PVND to the positive local input/output line LIO and the negative local input/output line LIOB during a precharge operation. For the description purposes, FIG. 4 illustrates a case that a core voltage VCC is supplied as the voltage of a precharge voltage terminal PVND. Of course, the voltage of a precharge voltage terminal PVND may be any voltage other than the core voltage VCC. For example, the voltage of a precharge voltage terminal PVND may have a level between the core voltage VCC and a ground voltage VSS. To be specific, the precharge unit may be designed to apply the voltage of the precharge voltage terminal PVND to the positive local input/output line LIO and the negative local input/output line LIOB in response to a first precharge signal or an first inverted precharge signal NPCGB which has an opposite phase to that of the precharge signal. The precharge unit 200 may include a plurality of transistors P1 and P2. FIG. 4 illustrates a case that the precharge unit 200 includes two PMOS transistors P1 and P2. When the first inverted precharge signal NPCGB is in a logic low level, the PMOS transistors P1 and P2 are turned on to transfer the voltage VCC of the precharge voltage terminal PVND to the positive local input/output line LIO and the negative local input/output line LIOB. When the first inverted precharge signal NPCGB is in a logic high level, the PMOS transistors P1 and P2 are turned off so that the voltage VCC of the precharge voltage terminal PVND is not transferred to the positive local input/output line LIO and the negative local input/output line LIOB. The non-volatile memory device may be designed to have the first inverted precharge signal NPCGB in a logic low level in a precharge duration and in a logic high level in a sensing duration.

The sensing unit 400 disables the precharge unit 200 when the voltage VCC of the precharge voltage terminal PVND of the precharge unit 200 goes out of a threshold range. The threshold range is a voltage range of the precharge voltage terminal PVND where the sense amplification unit 300 does not have a problem in sensing the data of the positive local input/output line LIO and the negative local input/output line LIOB. In other words, when the voltage level of the precharge voltage terminal PVND is changed to cause a problem in a sensing operation, the sensing unit 400 senses the change and disables the precharge unit 200. FIG. 4 shows a case that the sensing unit 400 disables the precharge unit 200 when the voltage level of the precharge voltage terminal PVND is lower than the level of {precharge reference voltage VREF−α}. The precharge reference voltage VREF is a voltage of the same level as the voltage applied to the precharge voltage terminal PVND and the precharge reference voltage VREF is kept at a constant level all the time. To be specific, if the precharge unit 200 is designed to apply the voltage of the precharge voltage terminal PVND to the positive local input/output line LIO and the negative local input/output line LIOB in response to the first inverted precharge signal NPCGB, the sensing unit 400 may be designed to output the first inverted precharge signal NPCGB of a logic high level to the precharge unit 200 when the voltage level of the precharge voltage terminal PVND of the precharge unit 200 becomes lower than the level of {precharge reference voltage VREF−α} even in a precharge duration.

The sensing unit 400 may include a comparator 41 and a logic combiner 42. The comparator 41 compares the voltage VCC level of the precharge voltage terminal PVND with a predetermined value. The predetermined voltage may be the level of {precharge reference voltage VREF−α}(precharge reference voltage VREF−α is threshold voltage). The logic combiner 42 performs a logic combination on an output signal of the comparator 41 and a first second inverted precharge signal PCGB and outputs the logic combination result as the first inverted precharge signal NPCGB to the precharge unit 200. To be specific, when the second inverted precharge signal PCGB is of a logic high level, the first inverted precharge signal NPCGB of a logic high level is outputted to the precharge unit 200 regardless of the output signal of the comparator 41. On the other hand, when the second inverted precharge signal PCGB is of a logic low level, the level of the first inverted precharge signal NPCGB is decided based on the output signal of the comparator 41. For example, when the second inverted precharge signal PCGB is of a logic low level and the output signal of the comparator 41 is of a logic low level (when the voltage VCC level of the precharge voltage terminal PVND is higher than the level of {precharge reference voltage VREF−α}), the first inverted precharge signal NPCGB of a logic low level is outputted to the precharge unit 200. When the second inverted precharge signal PCGB is of a logic low level and the output signal of the comparator 41 is of a logic high level (when the voltage VCC level of the precharge voltage terminal PVND is lower than the level of {precharge reference voltage VREF−α}), the first inverted precharge signal NPCGB of a logic high level is outputted to the precharge unit 200.

The sense amplification unit 300 senses and amplifies the voltage level difference between the positive local input/output line LID and the negative local input/output line LIOB and transfers the data of the positive local input/output line LID and the negative local input/output line LIOB to a global data line GIO.

Figure 5:
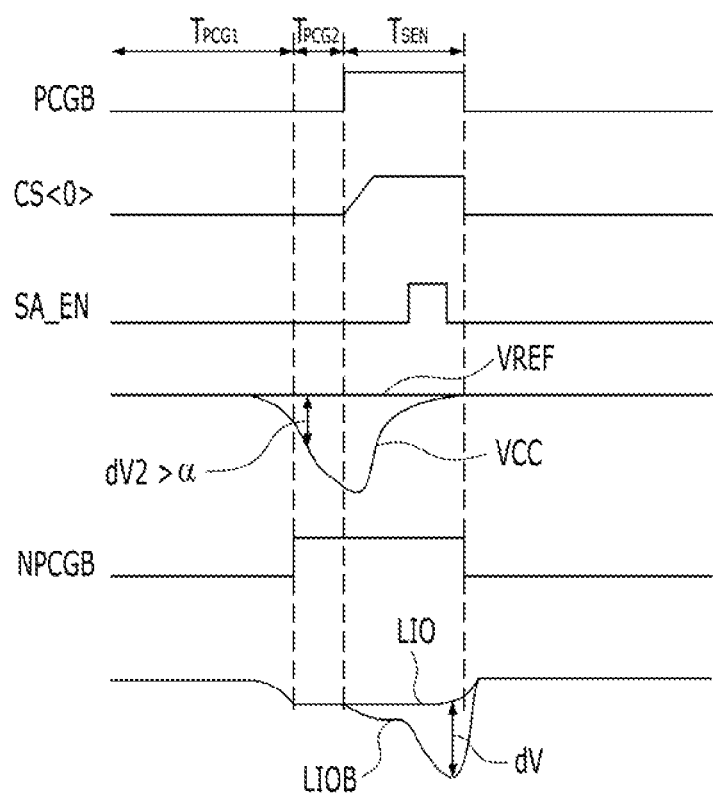
FIG. 5 is a timing diagram illustrating a read operation of the non-volatile memory device shown in FIG. 4 when a power drop occurs in the voltage level of a precharge voltage terminal in a precharge duration.

FIG. 5 is a timing diagram illustrating a read operation of the non-volatile memory device shown in FIG. 4 when a power drop occurs in the voltage VCC level of the precharge voltage terminal PVND in a precharge duration $T_{PCG1}$ and $T_{PCG2}$.

Referring to FIG. 5, the voltage VCC level of the precharge voltage terminal PVND is the same as the voltage level of the precharge reference voltage VREF in a first precharge duration $T_{PCG1}$ until a power drop occurs in the voltage VCC level of the precharge voltage terminal PVND. Since the second inverted precharge signal PCGB is in a logic low level and the voltage VCC level of the precharge voltage terminal PVND is higher than the level of {precharge reference voltage VREF−α} in the first precharge duration $T_{PCG1}$, the sensing unit 400 outputs the first inverted precharge signal NPCGB of a logic low level to the precharge unit 200.

The PMOS transistors P1 and P2 of the precharge unit 200 are turned on in response to the first inverted precharge signal NPCGB of a logic low level and the voltage VCC of the precharge voltage terminal PVND is applied to the positive local input/output line LIO and the negative local input/output line LIOB. Therefore the positive local input/output line LIO and the negative local input/output line LIOB are precharged to have the same voltage level as the core voltage VCC.

The voltage level difference dV2 between the voltage VCC of the precharge voltage terminal PVND and the precharge reference voltage VREF becomes greater than α due to the power drop, in a second precharge duration $T_{PCG2}$. In other words, the voltage VCC level of the precharge voltage terminal PVND is lower than the level of {precharge reference voltage VREF−α}) due to the power drop, and the sensing unit 400 outputs the first inverted precharge signal NPCGB of a logic high level to the precharge unit 200 during the second precharge duration $T_{PCG2}$.

The PMOS transistors P1 and P2 of the precharge unit 200 are turned off in response to the first inverted precharge signal NPCGB of a logic high level and the voltage VCC of the precharge voltage terminal PVND is not applied to the positive local input/output line LIO and the negative local input/output line LIOB although it is in a precharge duration. Therefore, as illustrated in FIG. 5, the voltage levels of the positive local input/output line LIO and the negative local input/output line LIOB are not lowered anymore in the second precharge duration $T_{PCG2}$.

Since the second inverted precharge signal PCGB is in a logic high level in the sensing duration $T_{SEN}$, the sensing unit 400 outputs the first inverted precharge signal NPCGB of a logic high level to the precharge unit 200, regardless of the voltage VCC level of the precharge voltage terminal PVND. The PMOS transistors P1 and P2 of the precharge unit 200 are turned off in response to the first inverted precharge signal NPCGB of a logic high level and the voltage VCC of the precharge voltage terminal PVND is not applied to the positive local input/output line LIO and the negative local input/output line LIOB.

Meanwhile, when the column selection signal CS<0> goes to a logic high level in the sensing duration $T_{SEN}$, the NMOS transistors N1 and N2 of the page buffer 100 are turned on to transfer the latched data D0 and /D0 to the positive local input/output line LIO and the negative local input/output line LIOB. For the description purposes, a case that the data D0 latched in the page buffer 100 is of a logic high level is described as an example. The NMOS transistor N1 is turned on in response to the column selection signal CS<0> of a logic high level and the inverted data /D0 of a logic low level is transferred to the negative local input/output line LIOB. As a result, the voltage level of the negative local input/output line LIOB drops. Also, since the data D0 of a logic high level is transferred by the NMOS transistor N2 of the page buffer 100 to the positive local input/output line LIO, the voltage level of the positive local input/output line LIO is maintained without a change. In short, while an amplification enabling signal SA_EN is in a logic low level in the sensing duration $T_{SEN}$, the voltage level difference dV between the positive local input/output line LIO and the negative local input/output line LIOB is caused by the data D0 and /D0 transferred from the page buffer 100.

When the amplification enabling signal SA_EN is enabled to a logic high level, the sense amplification unit 300 senses and amplifies the voltage level difference dV between the positive local input/output line LIO and the negative local input/output line LIOB and transfers the data of the positive local input/output line LIO and the negative local input/output line LIOB to the global data line GIO. Therefore, the voltage level difference dV between the positive local input/output line LIO and the negative local input/output line LIOB becomes even greater.

After all, when the voltage VCC level of the precharge voltage terminal PVND of the precharge unit 200 goes out of a threshold range, the non-volatile memory device according to the embodiment of the present invention senses it and disables the precharge unit 200 in order not to apply the voltage VCC of the precharge voltage terminal PVND to the positive local input/output line LIO and the negative local input/output line LIOB although it is in a precharge duration and to prevent the voltage levels of the positive local input/output line LIO and the negative local input/output line LIOB from going out of the threshold range. By doing so the voltage level difference dV between the positive local input/output line LIO and the negative local input/output line LIOB is sufficiently acquired more than offset and a stable sensing operation may be secured.

The case that a power drop occurs in the voltage VCC level of the precharge voltage terminal PVND in the precharge duration $T_{PCG}$ has been described in the above, but the power drop may occur in the voltage VCC level of the precharge voltage terminal PVND in the sensing duration $T_{SEN1}$ and $T_{SEN2}$ as well. In this case, the power drop may have no effect on a sensing operation. This is described below with reference to FIG. 6.

Figure 6:
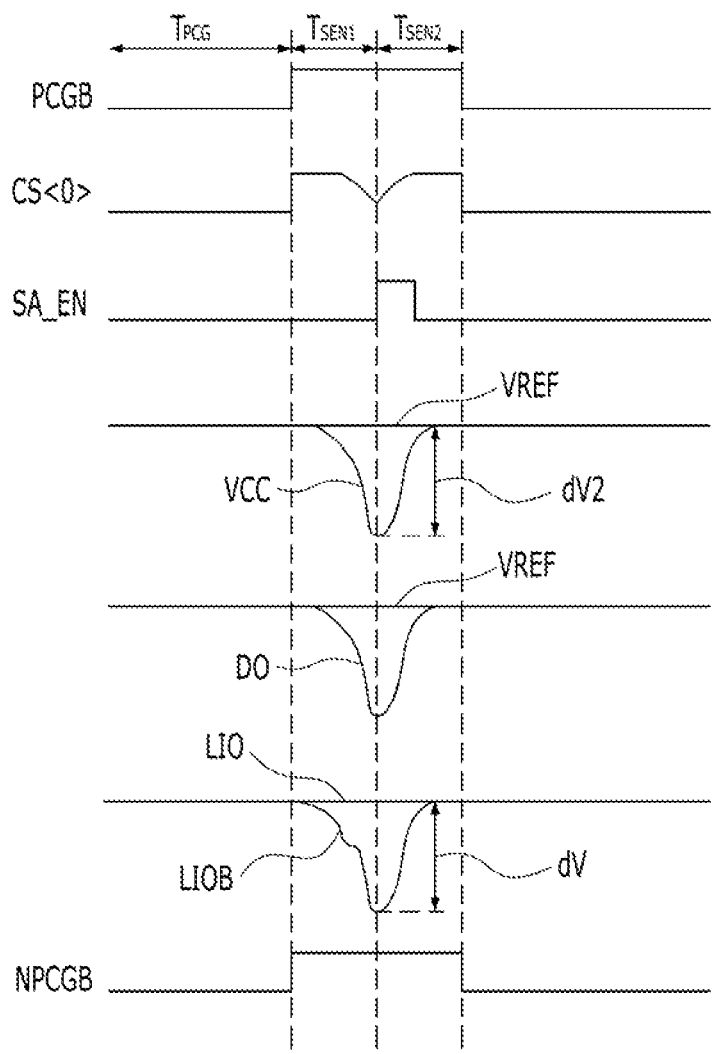
FIG. 6 is a timing diagram illustrating a read operation of the non-volatile memory device shown in FIG. 4 when a power drop occurs in the voltage level of a precharge voltage terminal in a sensing duration.

FIG. 6 is a timing diagram illustrating a read operation of the non-volatile memory device shown in FIG. 4 when a power drop occurs in the voltage level VCC of a precharge voltage terminal PVND in the sensing duration $T_{SEN1}$ and $T_{SEN2}$ Hereinafter, it is described that the page buffer 100 latches the data D0 of a logic high level for the description purposes.

Since the second inverted precharge signal PCGB is in a logic low level and the voltage VCC level of the precharge voltage terminal PVND is higher than the level of {precharge reference voltage VREF−α}) in the precharge duration $T_{PCG}$, the first inverted precharge signal NPCGB of a logic low level is transferred to the precharge unit 200.

The precharge unit 200 applies the voltage VCC of the precharge voltage terminal PVND to the positive local input/output line LIO and the negative local input/output line LIOB in response to the first inverted precharge signal NPCGB of a logic low level. As a result, the positive local input/output line LIO and the negative local input/output line LIOB are precharged to have the same voltage level as the core voltage VCC, which is the voltage level of the precharge reference voltage VREF.

Since the second inverted precharge signal PCGB goes to a logic high level in the sensing duration $T_{SEN1}$ and $T_{SEN2}$, the first inverted precharge signal NPCGB of a logic high level is transferred to the precharge unit 200 regardless of the voltage VCC level of the precharge voltage terminal PVND. In other words, although a power drop occurs in the voltage VCC level of the precharge voltage terminal PVND of the precharge unit 200 in a first sensing duration $T_{SEN1}$ and the voltage level difference dV2 between the voltage VCC of the precharge voltage terminal PVND and the precharge reference voltage VREF becomes greater than α, the first inverted precharge signal NPCGB of a logic high level is transferred to the precharge unit 200. As a result, the voltage VCC of the precharge voltage terminal PVND is not applied to the positive local input/output line LIO and the negative local input/output line LIOB anymore.

Meanwhile, the column selection signal CS<0> is enabled to a logic high level, which is the voltage level of the core voltage VCC, in the first sensing duration $T_{SEN1}$. When a power drop occurs in the voltage VCC level of the precharge voltage terminal PVND, the voltage level of the column selection signal CS<0> drops due to the power drop. This is because the column selection signal CS<0> is enabled to the level of the core voltage VCC as well.

Since the voltage level difference between the voltage applied to a gate of the NMOS transistor N1 of the page buffer 100 and the voltage applied to a source thereof is greater than a threshold voltage, the NMOS transistor N1 is turned on. Therefore, the inverted data /D0 of a logic low level is transferred to the negative local input/output line LIOB. Therefore, the voltage level of the negative local input/output line LIOB drops as shown in FIG. 6.

However, the voltage applied to a gate of the NMOS transistor N2 of the page buffer 100 and the voltage applied to a source thereof are the same, which is 'VREF−dV2'. Therefore, since the voltage level difference between the voltage applied to the gate of the NMOS transistor N2 of the page buffer 100 and the voltage applied to the source is lower than the threshold voltage, the NMOS transistor N2 is turned off. Since the data D0 of a logic high level latched in the page buffer 100 is not transferred to the positive local input/output line LI as a result of the turn-off of the NMOS transistor N2, the voltage level of the positive local input/output line LIO is maintained at a constant level without a change. After all, the voltage level difference dV between the positive local input/output line LIO and the negative local input/output line LIOB is acquired more than an offset of the sense amplification unit 300.

When the amplification enabling signal SA_EN is enabled to a logic high level in a second sensing duration $T_{SEN2}$, the sense amplification unit 300 senses and amplifies the voltage level difference dV between the positive local input/output line LIO and the negative local input/output line LIOB and transfers the data of the positive local input/output line LIO and the negative local input/output line LIOB to the global data line GIO.

After all, although a power drop occurs in the voltage VCC level of the precharge voltage terminal PVND in the sensing duration $T_{SEN1}$ and $T_{SEN2}$, the voltage level difference dV between the positive local input/output line LIO and the negative local input/output line LIOB is acquired more than an offset of the sense amplification unit 300. Therefore, the sense amplification unit 300 may properly perform a sensing operation. Meanwhile, when a power drop occurs in a precharge duration $T_{PCG}$, the power drop is sensed so that the voltage VCC of the precharge voltage terminal PVND is not applied to the positive local input/output line LIO and the negative local input/output line LIOB. In this way, the voltage level difference dV between the positive local input/output line LIO and the negative local input/output line LIOB is sufficiently acquired more than the offset of the sense amplification unit 300 and the sense amplification unit 300 may stably perform a sensing operation. In short, according to the embodiment of the present invention, although a power drop occurs in the voltage VCC level of the precharge voltage terminal PVND in any one between the precharge duration $T_{PCG1}$ and $T_{PCG2}$ and the sensing duration $T_{SEN1}$ and $T_{SEN2}$, a stable sensing operation may be performed.

Although the exemplary embodiments of the present invention describes that the technology of the present invention is applied to a non-volatile memory device, the present invention may be applied not only to the non-volatile memory device but also diverse integrated circuit chips that perform a precharge operation. In short, the present invention may be used to apply a precharge voltage to a data line during a precharge operation in diverse integrated circuit chips.

According to one embodiment of the present invention, the decrease in a sensing margin occurring due to a change in precharge voltage level may be minimized.

While the present invention has been described with respect to the specific embodiments, it will be apparent to those skilled in the art that various changes and modifications may be made without departing from the spirit and scope of the invention as defined in the following claims.

What is claimed is:

1. A precharge circuit, comprising:
   a precharge unit configured to apply a voltage of a precharge voltage terminal to a data line during a precharge operation when the precharge unit is enabled; and
   a sensing unit configured to disable the precharge unit when the voltage of the precharge voltage terminal goes out of a threshold range.

2. The precharge circuit of claim 1, wherein the precharge unit is configured to apply the voltage of the precharge voltage terminal to the data line when a precharge signal is enabled.

3. The precharge circuit of claim 2, wherein the sensing unit is configured to disable the precharge signal.

4. The precharge circuit of claim 1, wherein the voltage of the precharge voltage terminal includes a core voltage.

5. A non-volatile memory device, comprising:
   an access unit configured to access a data of a memory cell;
   a data line configured to receive the data of the memory cell through the access unit;
   a precharge unit configured to apply a voltage of a precharge voltage terminal to the data line during a precharge operation when the precharge unit is enabled; and
   a sensing unit configured to disable the precharge unit when the voltage of the precharge voltage terminal goes out of a threshold range.

6. The non-volatile memory device of claim 5, further comprising:
   an amplification unit configured to amplify a data loaded on the data line.

7. The non-volatile memory device of claim 5, wherein the precharge unit is configured to apply the voltage of the precharge voltage terminal to the data line when a precharge signal is enabled.

8. The non-volatile memory device of claim 7, wherein the sensing unit is configured to disable the precharge signal.

9. The non-volatile memory device of claim 5, wherein the voltage of the precharge voltage terminal includes a core voltage.

10. The non-volatile memory device of claim 5, wherein the access unit comprising:
    a latch configured to latch the data of the memory cell; and
    a selector configured to transfer the latched data to the data line in response to a selection signal.

11. The non-volatile memory device of claim 7, wherein the sensing unit comprising:
    a comparator configured to compare the voltage of the precharge voltage terminal with a predetermined value to generate a sensing signal based on a comparison result; and
    a controller configured to disable the precharge signal in response to the sensing signal.

12. The non-volatile memory device of claim 11, wherein the precharge signal is enabled during the precharge operation.

13. The non-volatile memory device of claim 11, wherein the predetermined value is a threshold voltage.

* * * * *